(12) United States Patent
Hung et al.

(10) Patent No.: US 11,049,585 B1
(45) Date of Patent: Jun. 29, 2021

(54) ON CHIP BLOCK REPAIR SCHEME

(71) Applicant: MACRONIX INTERNATIONAL CO., LTD., Hsinchu (TW)

(72) Inventors: Shuo-Nan Hung, Zhubei (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/832,983

(22) Filed: Mar. 27, 2020

(51) Int. Cl.
*G11C 29/00* (2006.01)
*G11C 29/44* (2006.01)
*G11C 11/409* (2006.01)
*G11C 29/26* (2006.01)

(52) U.S. Cl.
CPC ............ *G11C 29/44* (2013.01); *G11C 11/409* (2013.01); *G11C 29/26* (2013.01); *G11C 29/78* (2013.01)

(58) Field of Classification Search
CPC ....... G11C 29/44; G11C 11/409; G11C 29/26; G11C 29/78
USPC ........................................................ 365/200
See application file for complete search history.

(56) References Cited

U.S. PATENT DOCUMENTS

| | | | |
|---|---|---|---|
| 7,394,689 B2 | 7/2008 | Ryu | |
| 8,671,242 B2 | 3/2014 | Pekny | |
| 9,513,815 B2 | 12/2016 | Chang et al. | |
| 9,658,787 B2 | 5/2017 | Hung et al. | |
| 10,346,301 B2 | 7/2019 | Jo et al. | |
| 10,366,776 B2* | 7/2019 | Oh | G11C 29/4401 |
| 2006/0034136 A1 | 2/2006 | Abedifard | |
| 2008/0282045 A1* | 11/2008 | Biswas | G11C 29/76 711/159 |
| 2018/0151251 A1* | 5/2018 | Oh | G11C 29/76 |

OTHER PUBLICATIONS

"3V, 2G/4G-bit NAND Flash Memory, MX30LFxG28AC", Macronix International Co., Ltd., http://www.macronix.com, Revision 1.0, Dec. 1, 2016, 82 pages.
"Open NAND Flash Interface Specification," ONFi (www.onfi.org) Rev. 1, Dec. 28, 2006, 106 pages.

* cited by examiner

*Primary Examiner* — Xiaochun L Chen
(74) *Attorney, Agent, or Firm* — Haynes Beffel & Wolfeld LLP

(57) ABSTRACT

Field configurable bad block repair for a memory array comprising a plurality of blocks utilizes a block repair information store for data identifying one or more bad blocks in the array. The block repair information store includes nonvolatile memory writable at least once. Block repair circuitry on the device is configurable to redirect commands to access bad blocks identified in the bad block repair information store to reserved blocks in the memory array. A controller is responsive to a command to write bad block repair information, such as an identifier of a bad block in the plurality of blocks to the block repair information store in the field, and to reconfigure the block repair circuitry in the field using the updated information.

20 Claims, 6 Drawing Sheets

ON CHIP BLOCK REPAIR SCHEME

BACKGROUND

Field

The present invention relates to repair of bad blocks in large-scale memory devices, including NAND flash memory.

Description of Related Art

Large-scale memory arrays, including large-scale NAND flash memory, may not be perfect, with specifications allowing on the order of 2% or more bad blocks in the array during the lifetime of the device. Bad blocks can cause issues for users in some situations.

Bad block redundancy repair schemes have been deployed in some types of memory. These techniques are implemented in the factory to replace a limited number of bad blocks with redundant blocks using fuse circuits or the like, to reroute accesses from bad blocks to blocks within a set of extra blocks built into the device outside of the user addressable parts of the memory. This typical redundancy repair operation does not suffice for blocks that become bad during operation in the field, or for large numbers of blocks such as might be encountered on large-scale NAND flash memory devices.

It is desirable therefore to provide a technique allowing greater flexibility for repair of bad blocks in large-scale memory, including for repairing bad blocks in the field.

SUMMARY

A technology supporting field configurable bad block repair is described, suitable for use in large-scale integrated circuit memory.

A memory device is described that comprises a memory array such as a large-scale NAND flash array, comprising a plurality of blocks for storing data. A block repair information store for data identifying one or more bad blocks in the plurality of blocks is provided. The block repair information store includes nonvolatile memory writable at least once. Block repair circuitry on the device is configurable to redirect commands to access bad blocks identified in the bad block repair information store to reserved blocks in the memory array. A controller is responsive to a command to write bad block repair information, such as an identifier of a bad block in the plurality of blocks to the block repair information store, and is responsive to a block repair event to configure the block repair circuitry using data in the block repair information store, by copying the block repair information from the store to circuits at the block repair circuitry, if the store is not part of the block repair circuitry.

In embodiments described herein, the block repair information store can be updated, the block repair circuit automatically updated, and the block repair can be executed in response to commands in the field.

Embodiments are described in which the memory array includes a usable-region that encompasses the plurality of blocks, and the reserved blocks comprise a set of hidden blocks outside the usable-region. In other embodiments, the reserved blocks comprise blocks in the usable-region that are identified in the block repair information. In other embodiments, both hidden reserved blocks and usable-region reserved blocks can be utilized. Also, the controller can be responsive to a command to write a list of at least one usable-region reserved block into the block repair information store.

The technology can be embodied in a NAND flash memory array comprising a plurality of blocks for storing data. The block repair circuitry can be configurable in the field to redirect commands to access bad blocks identified in the block repair information store to reserved blocks in the memory array.

In addition, a method for operating a memory device for field configurable bad block repair is provided.

In general, the technology provided increases the flexibility of block repair operations for large-scale memory, and can result in more reliable deployments of memory in the field.

Other aspects and advantages of the present invention can be seen on review of the drawings, the detailed description and the claims, which follow.

DETAILED DESCRIPTION

A detailed description of embodiments of the present invention is provided with reference to the FIGS. 1-7.

Figure 1:
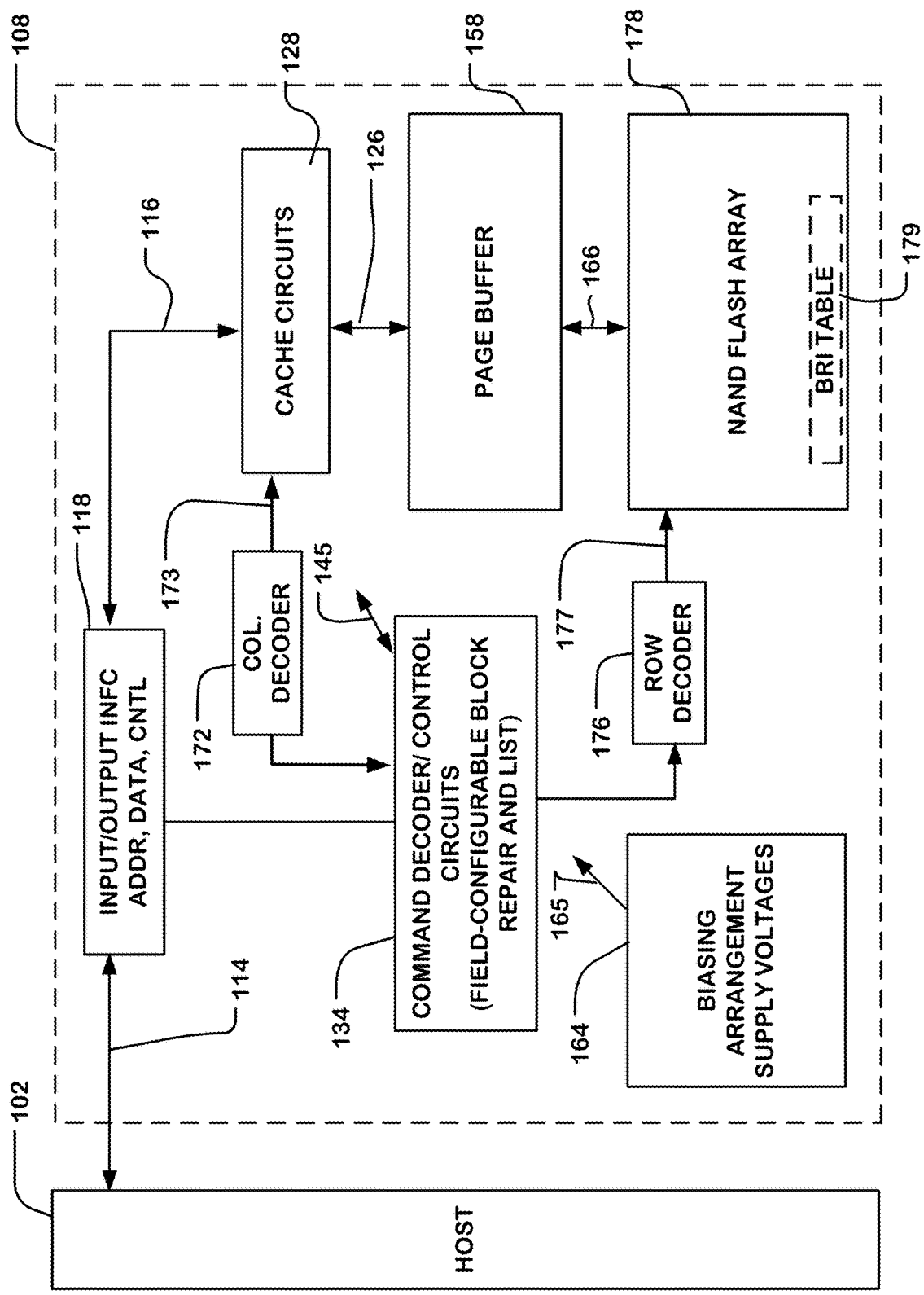
FIG. 1 is a block diagram showing a host and an integrated circuit memory device that comprises field-configurable block repair circuitry.

FIG. 1 is a simplified diagram of a memory system that includes a NAND flash memory device 108 implemented on an integrated circuit and a host 102. The example memory system includes logic for field configurable block repair as described herein.

In various embodiments, the memory device 108 can be implemented on a single integrated circuit chip, on a multichip module, or on a plurality of chips configured as suits a particular need. In yet other embodiments contemplated herein, the memory device may have other types of nonvolatile memory cells, including programmable resistance memory cells, such as metal oxide memory cells, magneto-resistive memory cells or phase change based memory cells, and so on.

The memory array 178 can be a NAND flash memory in embodiments contemplated herein implemented using two-dimensional or three-dimensional array technology. The memory array 178 is arranged in an array including a plurality of blocks of memory cells. The blocks of memory cells include sets of memory cells that fall within a specified range of addresses in the memory array, and can be said to have block addresses. In some embodiments of flash memory, erase operations are executed on sectors in the memory array that can be partitioned electrically during the erase operation from other sectors. Blocks of memory cells can encompass a single sector, and thus may be referred to as an erase block. In other embodiments, blocks of memory cells implemented for the purposes of the present technology may include more than one sector, or other configurations of memory cells.

An input/output interface 118 is included in which addresses and data may be provided on shared lines in an address/data bus 114. Also, serial interfaces may be deployed.

A row decoder 176 is coupled to a plurality of word lines 177, arranged along rows in the memory array 178. Word line decoders are included in row decoder 176. Page buffer circuits 158 are coupled to a plurality of bit lines 166 arranged along columns in the memory array 178 for reading data from and writing data to the memory array 178. Addresses are supplied on lines 114 from the host 102 via interface 118 and control circuits 134 implementing a command decoder and controller modules, to a column decoder 172, which is coupled to cache memory circuits 128, and to row decoder 176 coupled to word lines 177. In one implementation, the page buffer can be the same width as the memory array.

Page buffer circuits 158 are coupled by data lines 126 to the cache memory circuits 128, and can store pages of data. Bit lines 166 are coupled to the page buffer circuits 158, and to the memory array, and can comprise global bit lines (GBL) and local bit lines. Bit lines generally comprise conductors in higher patterned layers that can traverse a plurality of blocks or sectors of memory cells in an array, and connect to local bit lines in the blocks via select transistors. The local bit lines are connected to the memory cells for current flow to and from the bit lines, which in turn are connected to the bit lines 166 and page buffer circuits 158.

In a reading operation, data from the page buffer circuits 158 are supplied via second data lines 126 to cache circuits 128, in this example, which are in turn coupled to input/output interface 118 via data path lines 116. Also, input data is applied in this example to the cache circuits 128 on lines 116 from the interface 118, and to the page buffer circuits 158 on lines 126, for use in support of program operations.

Input/output interface 118 provides communication paths for the data with destinations external to the memory device 108. Input/output data and control signals are moved via data lines 114 between the input/output interface 118 and the control circuits 134 on the memory device 108. In some embodiments, other data sources internal or external to the memory device 108, can be included such as a general purpose processor or special purpose application circuitry, or a combination of modules providing system-on-a-chip functionality supported by the memory array 178.

In the example shown in FIG. 1, control circuits 134 include control modules implementing a bias arrangement state machine, or machines, which controls, or control, the application of supply voltages generated or provided through the voltage supply or supplies in block 164, such as read, erase, verify and program voltages including precharge voltages, for a set of selectable program and read operations. Supply voltages are applied to memory device 108, as shown by arrow 165. Control circuit signals are distributed to circuits in memory device 108, as shown by arrow 145.

The control circuits 134 are coupled to the cache circuits 128 and the memory array 178 and other elements of the integrated circuit as needed.

The circuits 134 can include modules implemented using special-purpose logic circuitry including state machines, as known in the art. In alternative embodiments, the circuits 134 can include modules implemented using a general-purpose processor, which can be implemented on the same integrated circuit, which execute a computer program to control the operations of the memory device 108. In yet other embodiments, a combination of special-purpose logic circuitry and a general-purpose processor can be utilized for implementation of modules in circuits 134.

As described herein, control circuits 134 include field configurable bad block repair circuits. The field configurable bad block repair circuits can include circuits or memory identifying a list of reserved blocks, and circuits or memory providing a mapping of bad blocks in the array to reserved blocks in the list. The field configurable bad block repair circuits can comprise circuit elements such as lookup tables, configuration registers, content addressable memory, comparators, and enable and disable circuits. field configurable bad block repair circuits can be configurable by writing data to the lookup tables, configuration registers or content addressable memory.

A block repair information BRI table 179 can be used to configure the bad block repair circuits with the list or the mapping or both, by transferring the information to the circuits. Also, the table 179 may be part of the bad block repair circuits. The BRI table 179 can be stored in nonvolatile memory on the device, such as within a prespecified region of the flash memory array 178. In other embodiments, the block repair information table 179 can be stored in a configuration register that can be written at least once located on other parts of the memory device 108. This configuration register can comprise flash memory cells, or other types of nonvolatile memory cells as suits a particular embodiment.

The field configurable bad block repair circuits can respond to or read the block repair information table 179 in response to a block repair event. A block repair event be the end of execution of an operation using the memory, a reset event, such as may occur on a chip power-on initialization operation, and completion of an operation to identify additional reserved blocks or additional bad blocks for block repair, at the end of an operation to write an identifier of a bad block, or other type of event, such as expiration of a timer, or a reset signal from a host. The block repair event can occur automatically in execution of an operation by the controller on the device, without user intervention. The block repair information can be applied to configure the circuitry to map user commands that redirect accesses addressed to bad blocks to the reserved blocks identified by the information.

The flash memory array 178 can comprise floating gate memory cells or dielectric charge trapping memory cells configured to store multiple bits per cell, by the establishment of multiple program levels that correspond to amounts of charge stored, which in turn establish memory cell threshold voltages VT. The technology can be used with single-bit-per-cell flash memory, and with other multiple-bit-per-cell (multiple-level cells storing more than one bit per cell (e.g., MLC, TLC or XLC)) and single-bit-per-cell memory technologies (single-level cells (SLC)). In other examples, the memory cells may comprise programmable resistance memory cells, phase change memory cells, and other types of nonvolatile and volatile memory cell technologies.

In the illustrated example, the host 102 is coupled to the address lines 144 and data lines 114 on the memory device 108, as well as other control terminals not shown, such as chip select terminals and so on, and can provide commands or instructions to the memory device 108 in the field. In some examples, the host 102 can be coupled to the memory device using a serial bus technology, using shared address and data lines. The host 102 can comprise a general purpose processor, a special purpose processor, a processor configured as a memory controller, or other processor that uses the memory device 108. All or part of the host 102 can be implemented on the same integrated circuit as the memory.

The host 102 can include a file system or file systems that store, retrieve, and update data stored in the memory based on requests from an application program or multiple application programs. In general, the host 102 can also include programs that perform memory management functions and other functions that can produce status information for data stored in the memory, including information marking data invalid as a result of such functions. Such functions can include, for example, wear leveling, bad block recovery, power loss recovery, garbage collection, error correction, and so on. Also, the host 102 can include application programs, file systems, flash translation layer programs and other components that can produce status information for data stored in the memory, including information marking data invalid as a result of such functions.

For the purposes of this description, the circuitry is "configurable in the field" or "responsive to commands in the field," because it is designed to be configured after manufacture by logic on the chip, or by a customer or user. Examples of configuration in the field include writing data to the block repair information table in response detection of bad blocks by error detection logic, writing data to the block repair information table in response to user commands originating in a host system identifying bad blocks, writing data in response to user commands originating in a host system identifying reserved blocks to a block repair information store 179, and resetting and re-creating block repair lists in the controller 134.

Figure 2:
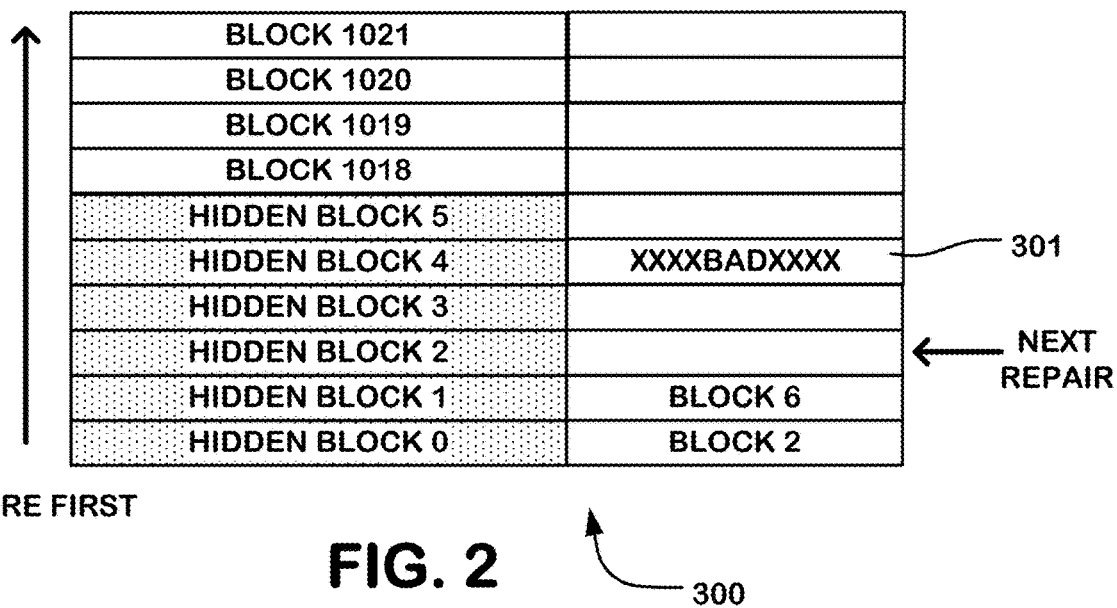
FIG. 2 illustrates a block repair list which can be maintained in a controller of a device like that of FIG. 1.

FIG. 2 is a schematic representation of a block repair list 300 which can be stored in registers accessible by the controller 134. In this example, the block repair list 300 includes a first column listing reserved blocks. The reserved blocks in this example include hidden blocks 0-5, and usable-region reserved blocks 1018-1021. The registers associated with each of the reserved blocks store addresses of bad blocks that map to the corresponding reserved block. Thus in this example, bad block BLOCK 2 maps to HIDDEN BLOCK 0. Bad block BLOCK 6 maps to HIDDEN BLOCK 1. The next reserved block to be utilized to repair a bad block can be identified in the repair circuitry by a pointer "Next Repair" identifying a next register in the register file.

In operation, for example, the bad block repair circuit can read the list of bad blocks from the block repair information table and repair them in order, by mapping a first bad block to a first reserved block in the list, a second bad block to a second reserved block in the list, and so on. Also, the block repair information table can identify bad reserved blocks (e.g. 301), and skip the bad reserved blocks in the repair process.

Figure 3:
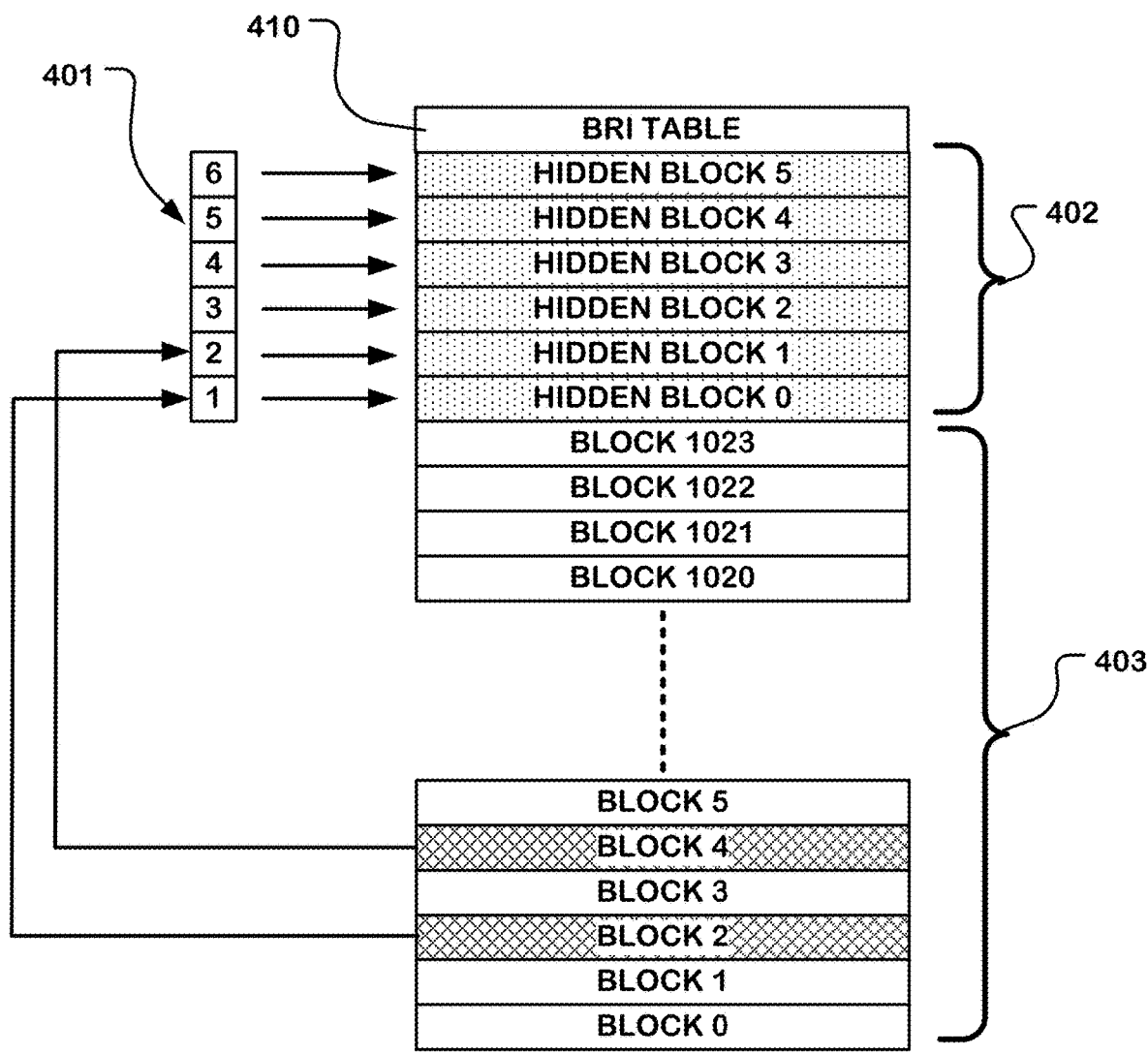
FIG. 3 illustrates field configurable block repair in a system that employs hidden reserved blocks.

FIG. 3 is a schematic showing a block repair operation. FIG. 3 illustrates the usable area of the memory array 403 as including blocks BLOCK 0 through BLOCK 1023. The reserved blocks include hidden blocks HIDDEN BLOCK 0 through HIDDEN BLOCK 5 in area 402, outside the user accessible address space. A block repair information table 410 outside of the normal area of the memory array is illustrated in this example, such as in a special nonvolatile register file accessible by the controller.

The block repair circuitry is represented by the stack 401 including one entry for each of the reserved blocks. During a configuration operation, such as after a reset of the memory device, the block repair circuitry maps the bad block BLOCK 2 to the first reserved block, and the bad block BLOCK 4 to the second reserved block. Additional bad blocks in the usable area of the memory array 403 can be mapped in sequence until all of the hidden reserved blocks in area 402 are utilized.

Figure 4:
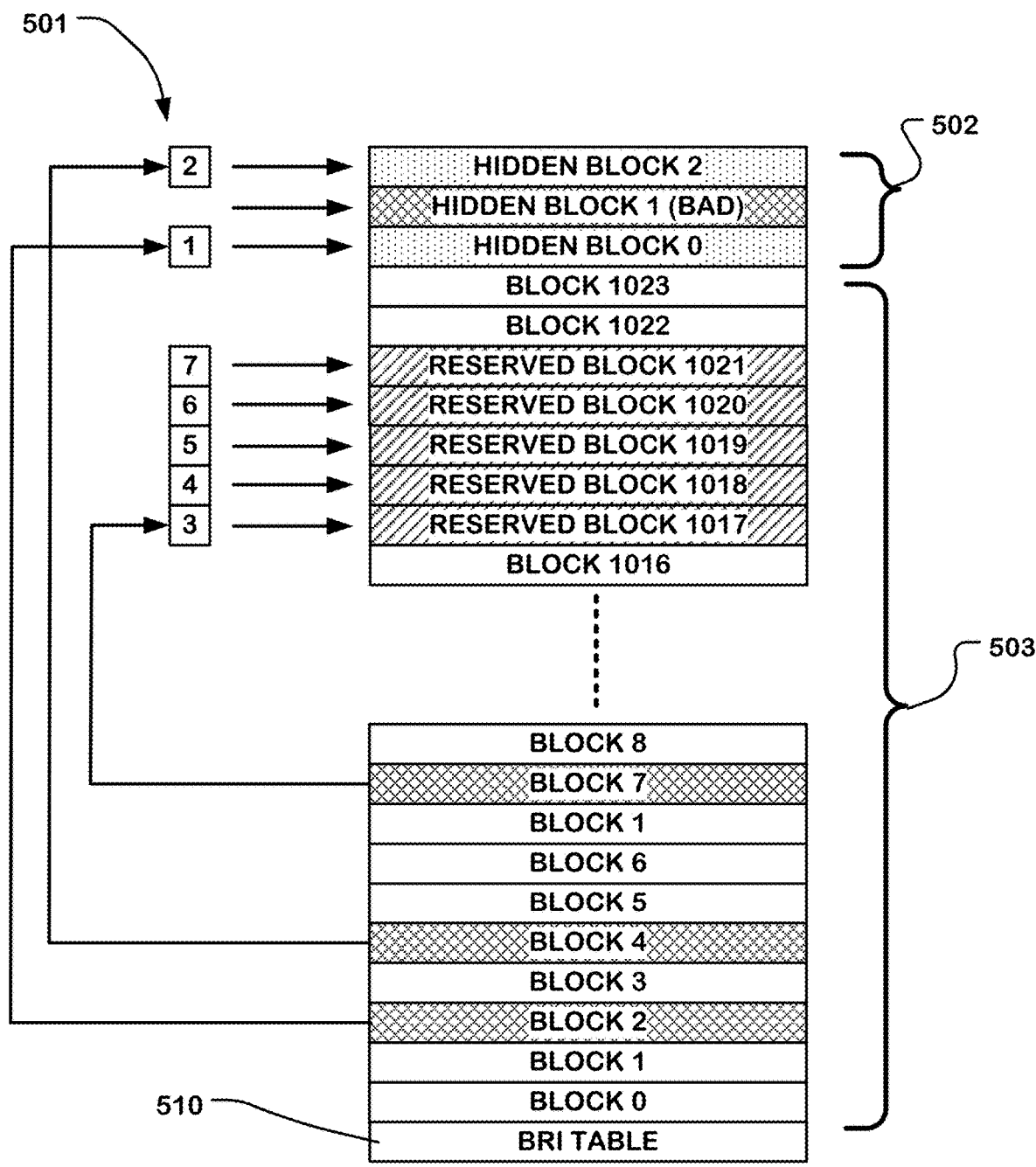
FIG. 4 illustrates field configurable block repair in a system that employs both hidden blocks and usable-region reserved blocks.

FIG. 4 is a schematic showing a block repair operation for an alternative embodiment, which includes both hidden blocks and usable-region reserved blocks. In FIG. 4, the usable area of the memory array 503 includes blocks BLOCK 0 through BLOCK 1023. A hidden area of the memory array 502 includes hidden blocks. A list of usable-region reserved blocks including BLOCK 1017 through BLOCK 1021 is stored in the block repair information table 510 for use by the block repair circuitry. In this example, the block repair information table 510 is stored in the user addressable area of the memory array.

In this example, there are 3 hidden blocks HIDDEN BLOCK 0 through HIDDEN BLOCK 2. However, HIDDEN BLOCK 1 is a bad block for the purposes of this example.

The block repair circuitry is represented by the stack 501, including one entry for each good hidden block, skipping the HIDDEN BLOCK 1 because it is bad. The block repair circuitry uses the hidden blocks first, mapping bad block BLOCK 2 to HIDDEN BLOCK 0, and bad block BLOCK 4 to HIDDEN BLOCK 2. Subsequent bad blocks, including bad block BLOCK 7 are mapped to usable-region reserved blocks in sequence, starting with the first reserved block BLOCK 1017. Utilizing usable-region reserved blocks specified by the user in the block repair information table 510, the user is provided additional techniques to configure the memory array to handle a variety of bad block situations.

The field configurable block repair circuitry can comprise a state machine implemented in hardware, using field configurable circuitry such as FPGA circuits, using general purpose processors and the like. Functions performed by the repair circuitry are described with reference to FIGS. 5-7.

Figure 5:
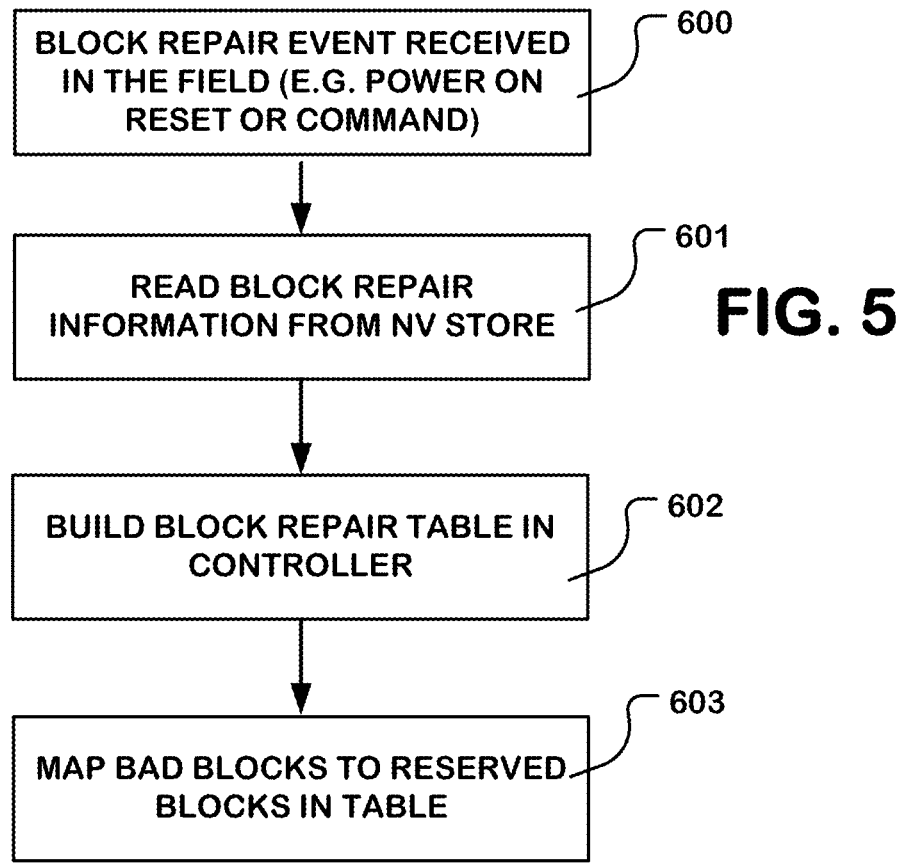
FIG. 5 is a flowchart of a procedure executed in support of field configurable bad block repair.

FIG. 5 illustrates one function executed by the controller for dynamic in-the-field bad block repair. In the sequence shown in FIG. 5, the procedure begins with a block repair event received in the field (600). A block repair event be the end of execution of an operation using the memory, a reset event, such as may occur on a chip power-on initialization operation, and completion of an operation to identify additional reserved blocks or additional bad blocks for block repair, at the end of an operation to write an identifier of a bad block, or other type of event, such as expiration of a timer, or a reset signal from a host. Upon detecting or receiving a block repair event, the controller reads the block repair information from a nonvolatile block repair information store on the device (601). Using the information read from the block repair information store, the controller builds a block repair table in a register file accessible by the controller (602). After the block repair table is built in the controller, the controller maps user accesses to add blocks to the reserved blocks (603).

Figure 6:
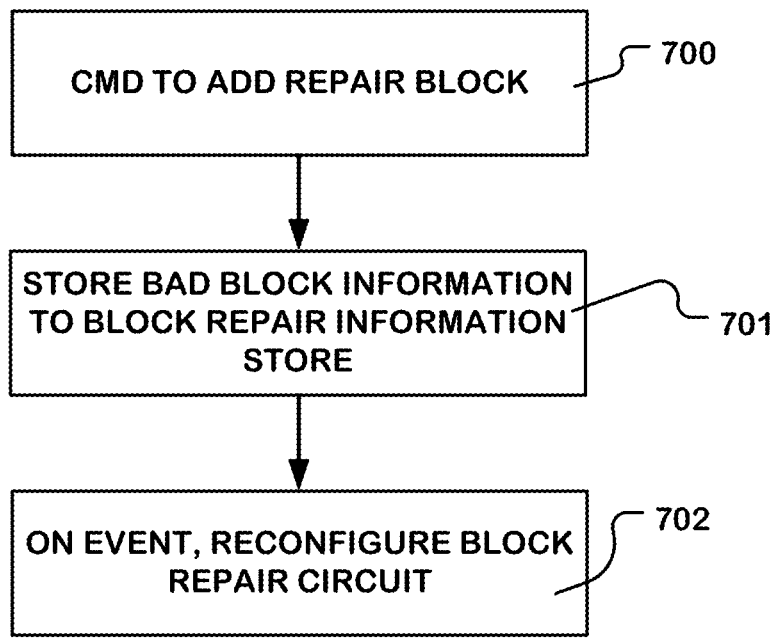
FIG. 6 is a flowchart of another procedure executed in support of field configurable bad block repair.

FIG. 6 illustrates one function executed by the controller upon detection of a bad block. In this procedure, a command is received to write an identifier of a bad block to the list of blocks to be repaired (700). This command can be received in the field. In response, bad block information is stored in the block repair information store on the device (701). Finally, on an event, such as at the end of, or during, the operation to write the identifier of the bad block, or at another event selected according to a particular implementation, the block repair circuit is reconfigured to repair the bad block identified in the field (702).

Figure 7:
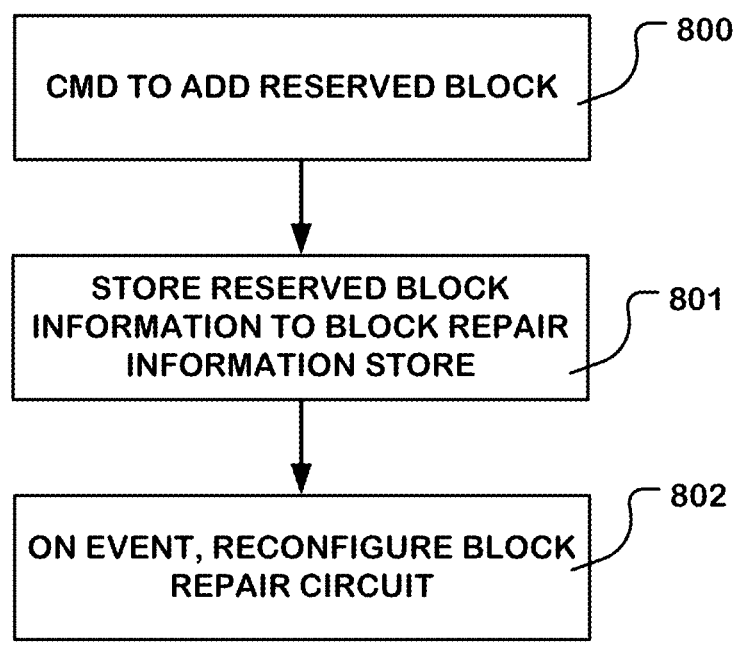
FIG. 7 is a flowchart of yet another procedure executed in support of field configurable bad block repair.

FIG. 7 illustrates another function executed by the controller to expand the capability of the device to repair bad blocks. In this procedure, a command is received to add a reserved block to the reserved blocks available to the block repair circuit (800). In response to the command, which can be received in the field, the block repair circuit can store reserved block information into the block repair information store (801). Finally, on an event, such as at the end of, or during the operation to add reserved blocks to the block repair store, the block repair circuit is reconfigured to repair the bad block using the newly identified reserved block (802).

Thus, a technology is described in which a group of reserved blocks is provided on an integrated circuit memory, such as a large-scale NAND flash memory, to be used for the purposes of block repair. The reserved blocks can include hidden blocks, in addition to hidden blocks that might be used for redundancy repair during manufacture, for example, and can include usable-region reserved blocks which can be specified by user commands in the field. Also, the reserved blocks can include both hidden blocks and usable-region reserved blocks.

In examples described herein block repair information is built up in the controller based upon the blocks in the group of reserved blocks. A bad block repair can be implemented using a block repair command that writes the bad block address into the block repair information table. Information is built up in the controller in the field. For example, information can be written to the table during a block repair event like at the end of execution of an operation using the memory, at a reset event, such as may occur on a chip power-on initialization operation, and after the user adds additional reserved blocks or additional bad blocks for block repair.

Field configurable bad block repair as described herein can solve some system failure situations that may arise from block failure in the field. Embodiments can be deployed with NOR flash, in which all bad blocks in the memory device could be repaired, achieving with high reliability devices in the field with no bad blocks apparent to the users. Embodiments can be deployed with large-scale and embedded NAND flash, and the repair can be focused on certain areas which have higher reliability specifications than others, so that the number of bad blocks within any given area is within the requirements of the application using the device.

A number of flowcharts illustrating logic executed by a memory controller or by a memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel, or performed in a different sequence without affecting the functions achieved. In some cases, as the reader will appreciate, a rearrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a memory array on an integrated circuit including a plurality of blocks for storing data;
   a block repair information store for block repair data identifying a list of reserved blocks in the memory array, and one or more bad blocks inside user accessible address space in the plurality of blocks, the block repair information store including nonvolatile memory on the integrated circuit and writable at least once;
   block repair circuitry to redirect commands to access bad blocks identified in a block repair table to reserved blocks in the list of reserved blocks; and
   a controller responsive to an event in the field to write block repair data from the block repair information store to the block repair table.

2. The memory device of claim 1, wherein the memory array includes a usable-region encompassing the plurality of blocks inside user accessible address space, and the reserved blocks comprise a set of hidden blocks outside the user accessible address space.

3. The memory device of claim 1, wherein the memory array includes a usable-region encompassing the plurality of blocks inside user accessible address space, and the reserved blocks comprise blocks within the usable-region listed in the block repair information store.

4. The memory device of claim 1, wherein the memory array includes a usable-region encompassing the plurality of blocks inside user accessible address space, the reserved blocks comprise blocks within the usable-region listed in the block repair information store, and the controller is responsive to a command to add a reserved block in the usable-region to the list of reserved blocks in the block repair information store.

5. The memory device of claim 1, wherein the memory array includes a usable-region encompassing the plurality of blocks inside user accessible address space, the reserved blocks comprise blocks within the user accessible address space listed in the block repair information store, and a set of hidden blocks outside the usable-region.

6. The memory device of claim 1, wherein the event in the field comprises a power-on reset of the device.

7. The memory device of claim 1, wherein the block repair information store comprises a region in the memory array.

8. The memory device of claim 1, wherein the memory array comprises NAND flash memory.

9. The memory device of claim 1, wherein the controller is responsive to a command in the field to write an identifier of a bad block in the plurality of blocks to the block repair information store, and responsive to a block repair event in the field to configure the block repair table in the block repair circuitry using data in the block repair information store.

10. The memory device of claim 1, wherein the controller includes circuitry to configure the block repair table in the block repair circuitry by mapping bad blocks identified in the block repair information store to reserved blocks in the list of reserved blocks.

11. The memory device of claim 1, wherein the controller includes circuitry to configure the block repair table in the block repair circuitry by mapping bad blocks identified in the block repair information store to reserved blocks in the list of reserved blocks, wherein the circuitry to configure the block repair table skips bad reserved blocks in the list of reserved blocks.

12. A memory device, comprising:
   a NAND flash memory array on an integrated circuit and including a plurality of blocks for storing data;
   a block repair information store for data identifying one or more bad blocks in the plurality of blocks and including a list of reserved blocks, the block repair information including nonvolatile memory on the integrated circuit writable in the field at least once;
   block repair circuitry to redirect commands to access bad blocks identified in the block repair information store to reserved blocks in the memory array, the block repair circuitry configured in response to power on reset event in the field using the list of reserved blocks and the identified one or more bad blocks; and
   a controller and command decoder on the integrated circuit responsive in the field to a first command to write an identifier of a bad block in the plurality of blocks to the block repair information store, and responsive to a second command to add a reserved block to the list of reserved blocks in the block repair information store.

13. A method for operating memory device, comprising a memory array on an integrated circuit including a plurality of blocks for storing data inside user accessible address space; comprising:
   storing data identifying one or more bad blocks in the plurality of blocks and a list of reserved blocks, in a block repair information store comprising nonvolatile memory on the integrated circuit writable at least once on the device;
   responding to command supplied to the integrated circuit in the field to write an identifier of a bad block in the plurality of blocks to the block repair information store; and
   configuring block repair circuitry in response to a block repair event using data in the block repair information store to redirect accesses to bad blocks identified in the block repair information store to reserved blocks in the list of reserved blocks.

14. The method of claim 13, wherein the memory array includes a usable-region encompassing the plurality of blocks inside user accessible address space, and the reserved blocks in the list of reserved blocks comprise a set of hidden blocks outside the usable-region.

15. The method of claim 13, wherein the memory array includes a usable-region encompassing the plurality of blocks, and the reserved blocks in the list of reserved blocks comprise blocks within the usable-region.

16. The method of claim 13, wherein the memory array includes a usable-region encompassing the plurality of blocks inside user accessible address space, the reserved blocks in the list of reserved blocks comprise blocks within the usable-region, and including responding to a second command in the field to add a block within the usable region to the list of reserved blocks in the block repair information store.

17. The method of claim 13, wherein the memory array includes a usable-region encompassing the plurality of blocks inside user accessible address space, the reserved blocks in the list of reserved blocks comprise blocks within the usable-region and a set of hidden blocks outside the usable-region.

18. The method of claim 13, wherein the block repair event comprises a power-on reset of the device.

19. The method of claim 13, wherein the block repair information store comprises a region in the memory array.

20. The method of claim 13, wherein the memory array comprises NAND flash memory.

* * * * *